US009681581B2

(12) United States Patent
Andres et al.

(10) Patent No.: US 9,681,581 B2
(45) Date of Patent: Jun. 13, 2017

(54) PLANAR HEAT CUP WITH CONFINED RESERVOIR FOR ELECTRONIC POWER COMPONENT

(71) Applicant: Goodrich Corporation, Charlotte, NC (US)

(72) Inventors: Michael J. Andres, Rockford, IL (US); Robert Scott Downing, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 132 days.

(21) Appl. No.: 14/525,493

(22) Filed: Oct. 28, 2014

(65) Prior Publication Data

US 2016/0120066 A1    Apr. 28, 2016

(51) Int. Cl.
*H05K 7/20* (2006.01)
*H01F 27/18* (2006.01)
*H01L 23/427* (2006.01)

(52) U.S. Cl.
CPC ......... *H05K 7/20336* (2013.01); *H01F 27/18* (2013.01); *H01L 23/427* (2013.01); *H05K 7/20936* (2013.01); *H01L 2924/0002* (2013.01)

(58) Field of Classification Search
CPC ........... H05K 7/20336; H05K 7/20936; H05K 7/2029; H05K 7/203; H05K 7/20309; H05K 7/20318; H05K 7/20327; H05K 7/20345; H01L 23/427; H01F 27/18
USPC ....................... 361/679.46–679.54, 688–723; 165/104.21, 104.22, 104.26
See application file for complete search history.

(56) References Cited

U.S. PATENT DOCUMENTS

| 7,275,588 | B2 | 10/2007 | Hsu | |
|---|---|---|---|---|
| 8,203,410 | B2 | 6/2012 | Sundstrom | |
| 8,305,762 | B2 | 11/2012 | Wits | |
| 8,680,959 | B2 | 3/2014 | Downing | |
| 2005/0099775 | A1* | 5/2005 | Pokharna | H01L 23/3736 361/700 |
| 2005/0145371 | A1* | 7/2005 | DiStefano | F28D 15/02 165/104.21 |
| 2005/0225943 | A1* | 10/2005 | Shih | F28D 15/0233 361/700 |
| 2006/0203451 | A1 | 9/2006 | Wei | |
| 2008/0122566 | A1* | 5/2008 | Tegart | F28D 15/0266 336/61 |

(Continued)

FOREIGN PATENT DOCUMENTS

EP          2757584 A2      7/2014

OTHER PUBLICATIONS

European Search Report for European Application No. 15191163.3 mailed Mar. 29, 2016.

*Primary Examiner* — Anthony Haughton
*Assistant Examiner* — Yahya Ahmad
(74) *Attorney, Agent, or Firm* — Carlon, Gaskey & Olds, PC

(57) ABSTRACT

A cooling system for cooling an electronic component has a heat pipe defined by an inner wall and an outer wall with an intermediate fluid chamber. The heat pipe has a wall to be put in contact with a cold plate and extends away from the cold plate to define a cup shape with a fluid movement member positioned within the chamber to move the fluid from an end of the chamber adjacent to the cold plate to a spaced end of the cup shape.

16 Claims, 1 Drawing Sheet

(56) References Cited

U.S. PATENT DOCUMENTS

| | | | | |
|---|---|---|---|---|
| 2009/0260782 | A1* | 10/2009 | Whitney | B21D 53/02 165/104.21 |
| 2010/0027220 | A1* | 2/2010 | Hughes | H05K 7/20445 361/702 |
| 2011/0176276 | A1* | 7/2011 | Sarraf | F28D 15/02 361/705 |
| 2012/0063092 | A1* | 3/2012 | Lee | G06F 1/20 361/700 |
| 2012/0326663 | A1* | 12/2012 | You | B60L 11/1812 320/109 |
| 2013/0133859 | A1* | 5/2013 | Glover | H01L 23/367 165/80.3 |
| 2013/0257574 | A1 | 10/2013 | Downing | |
| 2013/0308271 | A1* | 11/2013 | Pal | H05K 7/20936 361/700 |
| 2014/0202665 | A1* | 7/2014 | Paschkewitz | F28D 15/02 165/104.26 |
| 2015/0013941 | A1* | 1/2015 | Wong | H05K 7/20663 165/104.21 |

* cited by examiner

PLANAR HEAT CUP WITH CONFINED RESERVOIR FOR ELECTRONIC POWER COMPONENT

BACKGROUND OF THE INVENTION

This application relates to a method of communicating heat from an electronic power component to a cold plate.

Electronic power components are being utilized in greater numbers on many modern applications. These components generate high amounts of heat and, thus, require more efficient cooling schemes.

One common cooling member is a cold plate, which is placed adjacent to, or in contact with, electric components to remove heat. The cold plate is a heat transfer device, typically planar, wherein the coolant flows in multiple channels, such that heat is taken from the electric component into the cold plate and then transported to a remote location by advection to where the coolant is cooled by the ultimate heat sink, usually air but sometimes a fluid such as fuel.

It has been known to place electric power components and, in particular, inductors, in an intermediate aluminium cup to connect the component to the cold plate. This arrangement has some deficiencies.

SUMMARY OF THE INVENTION

A cooling system for cooling an electronic component has a heat pipe defined by an inner wall and an outer wall with an intermediate fluid chamber. The heat pipe has a wall to be put in contact with a cold plate and extends away from the cold plate to define a cup shape with a fluid movement member positioned within the chamber to move the fluid from an end of the chamber adjacent to the cold plate to a spaced end of the cup shape.

These and other features may be best understood from the following drawings and specification.

DETAILED DESCRIPTION

Figure 1:
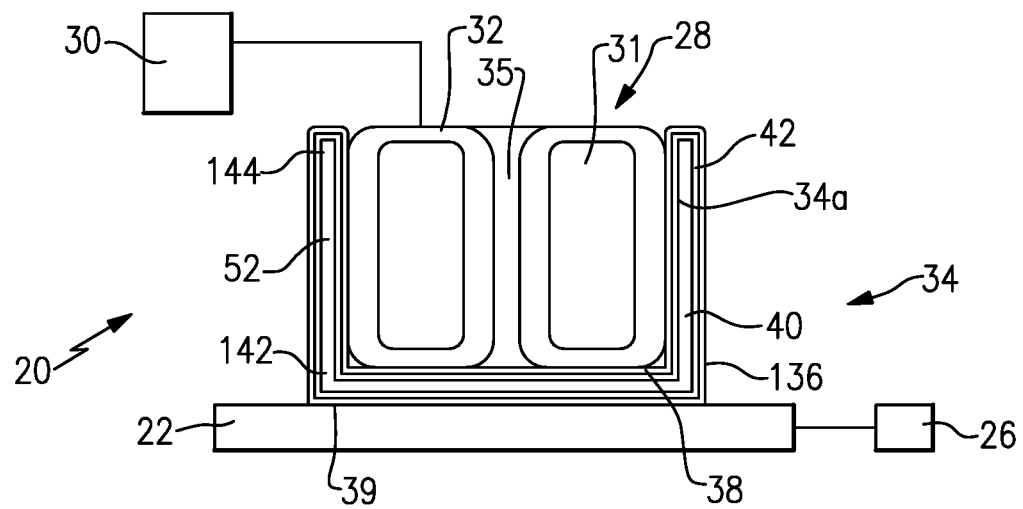
FIG. 1 shows an electric power component partially enclosed in a heat pipe.

A system 20 is illustrated in FIG. 1 and includes a cold plate 22 communicating with a heat sink heat exchanger 26. There could be any number of ways of taking heat away from the cold plate, such as a pump or blower, a heat pump, or any other such structure. As known, a surface 39 of a heat pipe 34 is in contact with the cold plate 22 and will draw heat from an electric component (here an inductor 28) and transfer that heat into the cold plate 22. The heat in the cold plate 22 is removed by transport of the heat transfer fluid to the heat sink heat exchanger 26, shown schematically. The inductor 28 communicates within an electric system 30 and may include any number of applications such as applications on an aircraft.

The component 28 is shown as an inductor, but it may be any number of other electronic power components. The outer perimeter of a toroidal inductor is especially suitable to the cup-shaped heat pipe. As shown, a core 31 includes copper wires 32, which are wrapped around a central core 35. As is clear from FIG. 1, the inductor is positioned within the heat pipe 34 such that outer surfaces of the inductor are in contact with inner surfaces of the heat pipe.

The heat pipe 34 may be formed of two planar heat pipe materials which are drawn, spun, or otherwise formed into a cup shape. Seams between pieces may be metallurgically bonded to form a hermetic vessel. This bonding may be by welding or brazing.

A fluid is included in a sealed cavity 40 and acts to transfer heat from an inner heat pipe face 38 to an outer heat pipe face 136. As is clear, the outer surface of the copper wires 32 contact the inner heat pipe face 38. A lower face 39 of the outer face 136 is in contact with the cold plate 22. A wick 42 is positioned within the cavity 40 and serves to wick the cooling fluid from a lower end 142 to an upper end 144. The wick lifts the liquid which was condensed at the cold plate interface by capillary force by having a network of interconnected pores. The wicked surface also covers the inside surface of the inside walls 34a. This porous wick both distributes the condensate over the heated wall, 34a and acts to enhance evaporation. Sintered porous metal or screen matrixes are common constructions but other materials may be used.

Desirably, the wick 42 is installed so that it is continuous and in direct contact with both the cold lower surface 39 and hot upper surface 52 to effectively convey liquid from one to the other as it transfers heat between the component 28 and the cold plate 22. The fluid essentially evaporates at a hot face adjacent component 28 and condenses at a cool face adjacent the cold plate 22.

The wick lifts the condensate with capillary force. The height that a liquid can be lifted in a wick is proportional to surface tension of the condensate and inversely proportional to the pore size in the wick material. Also contained in the heat pipe volume is open (non-wicked) space that allows vapor being formed by evaporation in heated regions to migrate to the cooled end of the heat pipe.

Fluid motion within the heat pipe driven by condensation and evaporation results in a nearly isothermal flow of heat which nearly eliminates the temperature difference that would occur in a solid walled cup.

Figure 2:
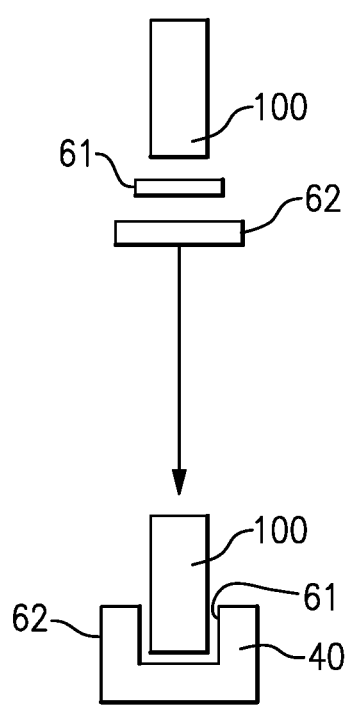
FIG. 2 schematically shows a method of forming a heat pipe.

FIG. 2 shows a method of forming the heat pipe 34. As shown, two initially flat or planar portions 61 and 62 are each deformed into a cup shape by a tool 100. This may be done either in a single operation or each piece extruded separately. Wall portions 61 and 62 are secured together to define the sealed cavity 40.

The wick may be formed of sintered or foam metal which has been developed with small pores for evaporation and capillarity. These materials are available from Thermacore, ACT or other heat pipe vendors.

The planar heat pipe materials 61 and 62 may be copper, aluminum, stainless steel and selected for compatibility with the working fluid. The working fluid is selected for having good thermal properties in the vapor and liquid phases and a vapor pressure that is easily contained in the vessel without excessive wall thickness.

Acceptable planar heat pipe materials are available from i2C of Louisville, Colo., as Flexible—Conformal Thermal Ground Planes.

Although an embodiment of this invention has been disclosed, a worker of ordinary skill in this art would recognize that certain modifications would come within the scope of this invention. For that reason, the following claims should be studied to determine the true scope and content of this invention.

The invention claimed is:

1. An electric system comprising:
   an electronic component received within a cup shaped heat pipe, a wall of said heat pipe in contact with a cold plate;
   the heat pipe defined by an inner wall and an outer wall with an intermediate fluid chamber, said heat pipe extending away from said cold plate to define a cup shape, with a fluid movement member positioned within the chamber to move the fluid from an end of said chamber adjacent to the cold plate to a spaced end of said cup shape; and
   wherein said component is a toroidal inductor.

2. The electric system as set forth in claim 1, wherein the fluid movement member is a wick.

3. The electric system as set forth in claim 2, wherein the heat pipe is formed of planar heat pipe material.

4. The electric system as set forth in claim 3, wherein said cold plate communicates with a heat pump.

5. The electric system as set forth in claim 2, wherein said cold plate communicates with a heat pump.

6. The electric system as set forth in claim 1, wherein the heat pipe is formed of planar heat pipe material.

7. The electric system as set forth in claim 1, wherein said cold plate communicates with a heat sink.

8. The electric system as set forth in claim 1, wherein said toroidal inductor includes wires defining an outer surface, with said outer surface of said wires being in contact with said inner wall of said heat pipe.

9. The electric system as set forth in claim 2, wherein said wick lifts the fluid from the cold plate interface by capillary force with a network of interconnected pores.

10. The electric system as set forth in claim 9, wherein said wick covers an inside surface of said inner wall.

11. The electric system as set forth in claim 3, wherein said wick covers an inside surface of said inner wall.

12. The electric system as set forth in claim 11, wherein said wick lifts the fluid from the cold plate interface by capillary force with a network of interconnected pores.

13. The electric system as set forth in claim 2, wherein said wick covers an inside surface of said inner wall.

14. The electric system as set forth in claim 8, wherein said fluid movement member is a wick, and said wick covers an inside surface of said inner wall.

15. The electric system as set forth in claim 14, wherein said wick lifts the fluid from the cold plate interface by capillary force with a network of interconnected pores.

16. The electric system as set forth in claim 8, wherein said wick lifts the fluid from the cold plate interface by capillary force with a network of interconnected pores.

* * * * *